United States Patent
So et al.

(10) Patent No.: US 10,163,384 B2
(45) Date of Patent: Dec. 25, 2018

(54) FLAT PANEL DISPLAY

(71) Applicant: SAMSUNG DISPLAY CO., LTD., Yongin-si, Gyeonggi-Do (KR)

(72) Inventors: Dong Yoon So, Yongin-si (KR); Kyung Min Park, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/720,914

(22) Filed: Sep. 29, 2017

(65) Prior Publication Data
US 2018/0102083 A1  Apr. 12, 2018

(30) Foreign Application Priority Data

Oct. 6, 2016 (KR) .................. 10-2016-0129106

(51) Int. Cl.
*G09G 3/20* (2006.01)
*H01L 27/32* (2006.01)
*H01L 51/52* (2006.01)
*G09G 3/22* (2006.01)

(52) U.S. Cl.
CPC ......... *G09G 3/2092* (2013.01); *G09G 3/2085* (2013.01); *G09G 3/22* (2013.01); *H01L 27/3276* (2013.01); *H01L 51/5203* (2013.01); *H01L 51/5253* (2013.01); *G09G 2300/0408* (2013.01); *G09G 2300/0426* (2013.01); *G09G 2300/0434* (2013.01); *G09G 2300/0439* (2013.01)

(58) Field of Classification Search
None
See application file for complete search history.

(56) References Cited

U.S. PATENT DOCUMENTS

| | | | |
|---|---|---|---|
| 7,796,228 B2 | 9/2010 | Kim et al. | |
| 9,482,900 B2 | 11/2016 | Yun et al. | |
| 9,647,449 B2 | 5/2017 | Zannoth | |
| 2014/0353670 A1* | 12/2014 | Youn | H01L 27/124 257/72 |

FOREIGN PATENT DOCUMENTS

| | | |
|---|---|---|
| KR | 10-0943284 | 2/2010 |
| KR | 10-1365118 | 2/2014 |
| KR | 10-2014-0139287 | 12/2014 |
| KR | 10-2015-0048364 | 5/2015 |

* cited by examiner

*Primary Examiner* — Ashok Patel
(74) *Attorney, Agent, or Firm* — F. Chau & Associates, LLC

(57) ABSTRACT

A flat panel display includes: a substrate that includes a display region and a non-display region at a periphery of the display region; a pixel array disposed on the substrate of the display region; an input pad part disposed on the substrate of the non-display region; a bonding pad part disposed on the substrate of the non-display region, the bonding pad part including a plurality of output pads connected to the pixel array and a plurality of input pads connected to the input pad part; and a protective layer disposed on the substrate of the non-display region, the protective layer having openings formed therein that expose portions of the bonding pad part and the input pad part, wherein the opening of the protective layer is smaller than the bonding pad part, wherein the protective layer is thinner at a portion that overlaps the bonding pad part than at other portions.

20 Claims, 3 Drawing Sheets

FLAT PANEL DISPLAY

CROSS REFERENCE TO RELATED APPLICATIONS

The present application claims priority under 35 U.S.C. § 119 from, and the benefit of, Korean Patent Application No. 10-2016-0129106, filed on Oct. 6, 2016 in the Korean Intellectual Property Office, the contents of which are herein incorporated by reference in their entirety.

BACKGROUND

1. Technical Field

Embodiments of the present disclosure are directed to a flat panel display, and more particularly, to a flat panel display in which a driving circuit is mounted in the form of an integrated circuit (IC) chip.

2. Discussion of the Related Art

In general, a flat panel display such as a liquid crystal display (LCD) or an organic light emitting display (OLED) is a display device that includes a pixel array. The pixel array includes a plurality of pixels. The plurality of pixels may be connected, for example, in a matrix form between scan and data lines.

The pixel array is disposed in a display region of a substrate. A scan driving circuit and a data driving circuit for driving the pixel array are disposed in a non-display region. A scan signal is sequentially transmitted from the scan driving circuit to a plurality of scan lines to select pixels, and a data signal is transmitted from the data driving circuit to a data line connected to the selected pixels, thereby displaying a predetermined image.

The scan driving circuit and the data driving circuit may be directly formed on the substrate in a process of manufacturing the display device, or may be manufactured as separate integrated circuit (IC) chips to be mounted on the substrate.

When a driving circuit is manufactured as a separate IC chip, the IC chip may be mounted on a bonding pad part of the substrate using a chip on glass method, a wire bonding method, etc. In this process, an unwanted electrical short circuit can occur between the IC chip and the bonding pad part or a power line, which can cause a failure.

SUMMARY

Embodiments can provide a flat panel display that can prevent an electrical short circuit that can occur when an integrated circuit (IC) chip is mounted on a substrate.

Embodiments can also provide a flat panel display in which an IC chip can be easily mounted on a substrate, and a complete electrical connection between the IC chip and a bonding pad part can be formed.

According to an embodiment of the present disclosure, there is provided a flat panel display that includes: a substrate that includes a display region and a non-display region at a periphery of the display region; a pixel array disposed on the substrate of the display region, the pixel array displaying an image; an input pad part disposed on the substrate of the non-display region; a bonding pad part disposed on the substrate of the non-display region, the bonding pad part including a plurality of output pads connected to the pixel array and a plurality of input pads connected to the input pad part; and a protective layer disposed on the substrate of the non-display region, the protective layer having openings formed therein that expose at least portions of the bonding pad part and the input pad part, where the opening of the protective layer is smaller than the bonding pad part, and the protective layer is thinner at a portion that overlaps the bonding pad part than at other portions.

The flat panel display may further include at least two power lines that connect the input pad part to the input pads of the bonding pad part, the at least two power lines being supplied with voltages different from each other. At least one power line may intersect a short side of the bonding pad part.

At least one power line is supplied with one of a voltage that detects a failure caused by a crack of the substrate or a voltage that drives the pixel array.

The protective layer may overlap a portion of the short side of the bonding pad part. The protective layer may include concave and convex parts at a side portion thereof that overlaps the short side of the bonding pad part. The at least one power line may be disposed at a lower portion of the protective layer and overlaps the convex part of the protective layer.

The at least two power lines may be disposed in different layers with an insulating layer interposed therebetween.

The flat panel display may further include an integrated circuit chip mounted on the bonding pad part that is electrically connected to the input pads and the output pads. A portion of a short side of the integrated circuit chip may overlap the protective layer.

The flat panel display may further include an anisotropic conductive film that includes a plurality of conductive balls interposed between the bonding pad part and the integrated circuit chip.

The protective layer may be made of an organic material. The protective layer may be formed in a stack structure that includes a first layer and a second layer, and a portion of the first layer may overlap the bonding pad part.

According to an embodiment of the present disclosure, there is provided a flat panel display that includes: a substrate that includes a display region and a non-display region at a periphery of the display region; a pixel array disposed on the substrate of the display region, the pixel array displaying an image; an input pad part disposed on the substrate of the non-display region; a bonding pad part disposed on the substrate of the non-display region, the bonding pad part including a plurality of output pads connected to the pixel array and a plurality of input pads connected to the input pad part; and a protective layer disposed on the substrate of the non-display region, the protective layer having openings formed therein that expose at least portions of the bonding pad part and the input pad part, where the opening of the protective layer is smaller than the bonding pad part, and the protective layer overlaps a portion of the short side of the bonding pad part.

The flat panel display may further include at least two power lines that connect the input pad part to the input pads of the bonding pad part, the at least two power lines being supplied with voltages different from each other. At least one power line may intersect a short side of the bonding pad part.

The at least one power line may be supplied with one of a voltage that detects a failure caused by a crack of the substrate or a voltage that drives the pixel array.

The protective layer may be thinner at a portion that overlaps the bonding pad part than at other portions. The protective layer may further include concave and convex parts at a side portion thereof that overlaps the short side of the bonding pad part, wherein the at least one power line is disposed at a lower portion of the protective layer to overlap the convex part of the protective layer.

The at least two power lines may be disposed in different layers with an insulating layer interposed therebetween.

The flat panel display may further include an integrated circuit chip mounted on the bonding pad part that is electrically connected to the input pads and the output pads. A portion of a short side of the integrated circuit chip may overlap the protective layer.

The flat panel display may further include an anisotropic conductive film that includes a plurality of conductive balls interposed between the bonding pad part and the integrated circuit chip.

The protective layer may be made of an organic material. The protective layer may be formed in a stack structure that includes a first layer and a second layer, and a portion of the first layer overlaps the bonding pad part.

DETAILED DESCRIPTION

Figure 1:
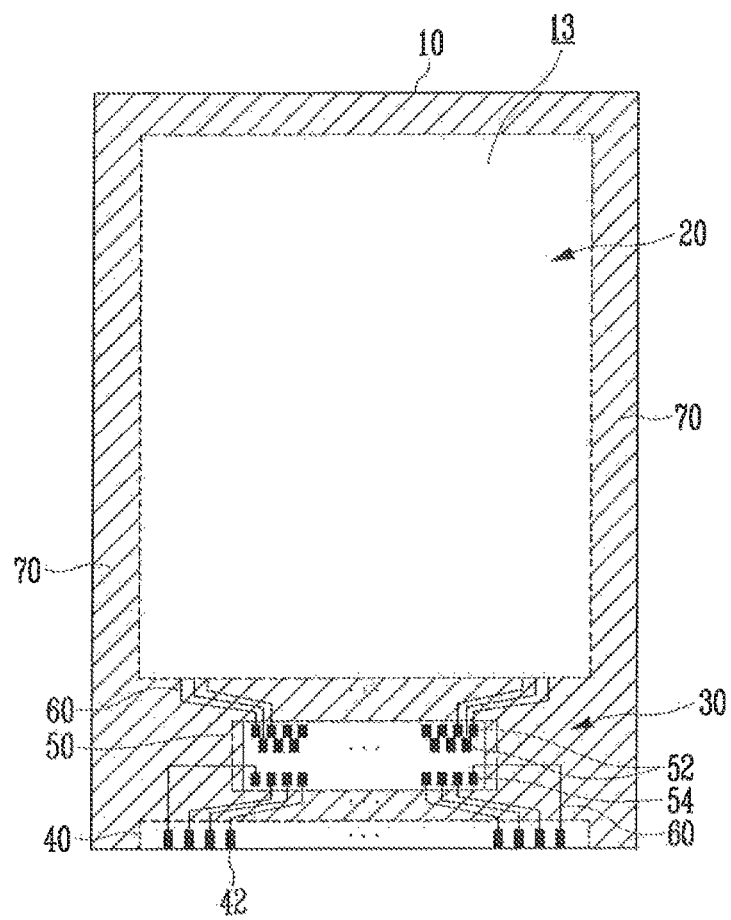
FIG. 1 is a schematic plan view that illustrates a flat panel display according to an embodiment of the present disclosure.

Exemplary embodiments will now be described more fully hereinafter with reference to the accompanying drawings; however, they may be embodied in different forms and should not be construed as limited to the embodiments set forth herein.

In the drawing figures, dimensions may be exaggerated for clarity of illustration. It will be understood that when an element is referred to as being "between" two elements, it can be the only element between the two elements, or one or more intervening elements may also be present. Like reference numerals may refer to like elements throughout.

Hereinafter, exemplary embodiments of the present disclosure will be described with reference to the accompanying drawings. However, it is to be understood by those skilled in the art that various modifications can be made in the following embodiments of the present invention, and the scope of the present invention is not limited to the following embodiments.

Figure 2:
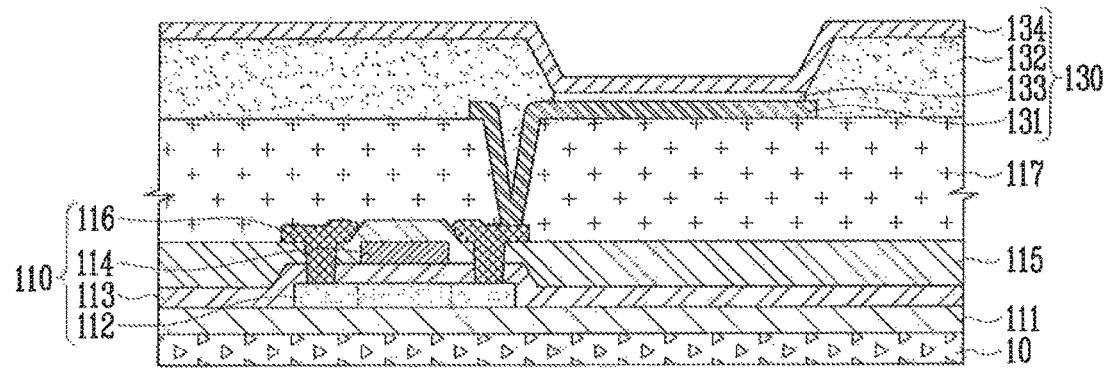
FIG. 2 is a sectional view that illustrates a pixel array according to an embodiment of the present disclosure.

FIG. 1 is a schematic plan view that illustrates a flat panel display according to an embodiment of the present disclosure. FIG. 2 is a sectional view that illustrates a pixel array according to an embodiment of the present disclosure.

Referring to FIG. 1, a substrate 10 includes a display region 20 and a non-display region 30 at the periphery of the display region 20.

A pixel array 13 that displays an image is disposed on the substrate 10 of the display region 20.

According to an embodiment, an input pad part 40, a bonding pad part 50, and various conductive lines 60 that connect the input pad part 40 and the bonding pad part 50 and connect the bonding pad part 50 and the pixel array 13 are disposed on the substrate 10 of the non-display region 30. The various conductive lines 60 include power and signal lines.

In addition, according to an embodiment, a protective layer 70 that has openings formed therein is formed on the substrate 10 of the non-display region 30 such that at least portions of the input pad part 40 and the bonding pad part 50 are exposed through the openings.

According to an embodiment, an encapsulation substrate or encapsulation thin film for sealing the display region 20 is disposed on the substrate, including the display region 20, the pixel array 13 and a portion of the non-display region 30.

According to an embodiment, the substrate 10 is formed in the shape of a plate or film made of glass, resin, a polymer compound, etc.

According to an embodiment, the pixel array 13 includes a plurality of pixels. Each pixel includes, for example, an organic light emitting diode (OLED). The plurality of pixels are connected, for example, in a matrix form between a plurality of scan lines and a plurality of data lines.

Referring to FIG. 2, according to an embodiment, an organic light emitting diode 130 includes an anode electrode 131, a cathode electrode 134, and an organic emitting layer 133 between the anode electrode 131 and the cathode electrode 134. The organic emitting layer 133 is formed on the anode electrode 131 of an emission region defined by a pixel defining layer 132, and includes a hole injection layer, a hole transport layer, an electron transport layer, and an electron injection layer.

In addition, according to an embodiment, a thin film transistor 110 that controls an operation of the organic light emitting diode 130 and a capacitor that maintains a signal are connected to the organic light emitting diode 130. The thin film transistor 110 includes a semiconductor layer 112 that provides source and drain regions and a channel region, a gate electrode 114 insulated from the semiconductor layer 112 by a gate insulating layer 113, and source and drain electrodes 116 connected to the source and drain regions of the semiconductor layer 112 through contact holes formed in an insulating layer 115 and the gate insulating layer 113. Additional components include a buffer layer 111, and a planarization insulating layer 117.

According to an embodiment, the input pad part 40 includes a plurality of pads 42 arranged at one edge of the substrate 10, and various driving power (voltages) and signals that display images are received from the outside through the plurality of pads 42.

According to an embodiment, the bonding pad part 50 is disposed between the pixel array 13 and the input pad part 40. The bonding pad part 50 includes a plurality of output pads 52 connected to the pixel array 13 and a plurality of input pads 54 connected to respective pads 42 of the input pad part 40. An integrated circuit (IC) chip is mounted on the bonding pad part 50 as a driving circuit that processes signals received from the outside through the input pad part 40 and transmits the processed signals to the pixel array 13.

Figure 3:
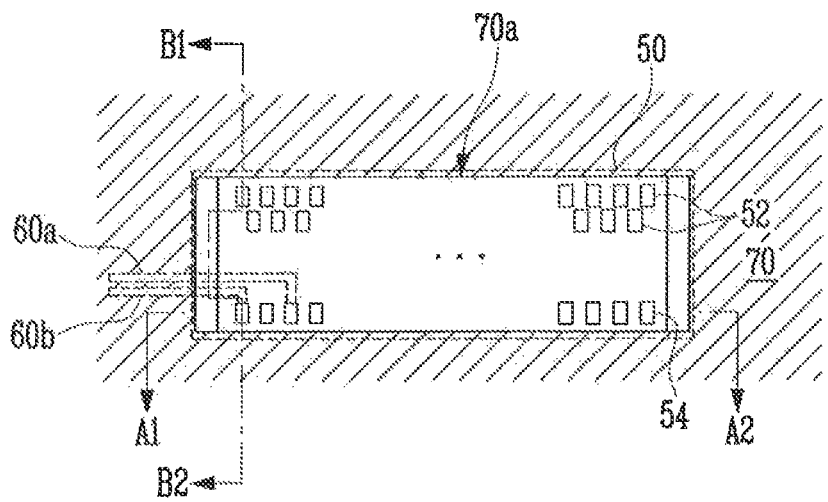
FIG. 3 is an enlarged plan view of a bonding pad part shown in FIG. 1.
Figure 4:
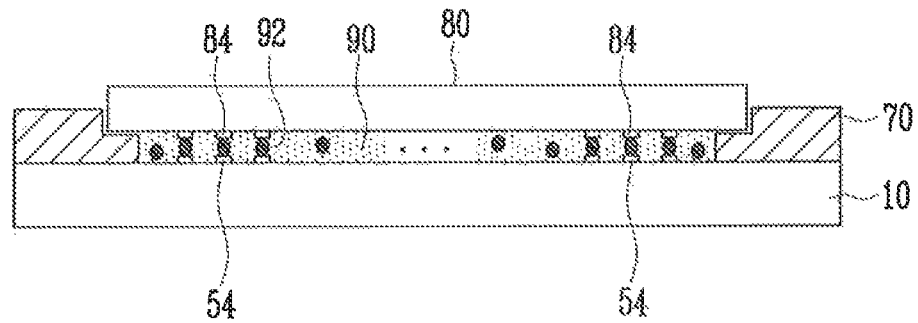
FIG. 4 is a sectional view taken along line A1-A2 of FIG. 3.
Figure 5:
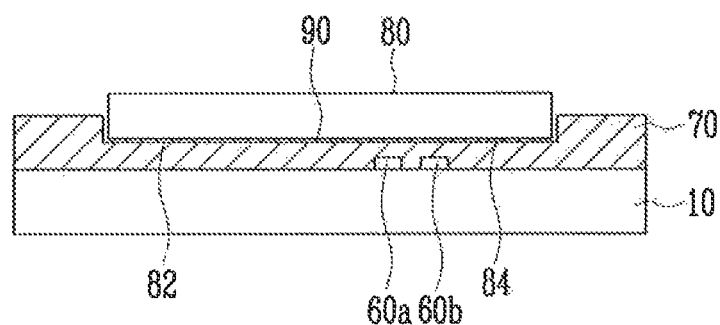
FIG. 5 is a sectional view taken along line B1-B2 of FIG. 3.

FIG. 3 is an enlarged plan view of the bonding pad part 50 shown in FIG. 1. FIG. 4 is a sectional view taken along line A1-A2 of FIG. 3. FIG. 5 is a sectional view taken along line B1-B2 of FIG. 3.

According to an embodiment, a device forming layer that includes the pixel array 13 is disposed on the substrate 10, and the input pad part 40, the bonding pad part 50, and the various conductive lines 60 are disposed on the device forming layer.

Referring to FIGS. 3 to 5, according to an embodiment, the protective layer 70 has an opening 70a that exposes at least one portion of the bonding pad part 50 therethrough. The opening 70a is smaller than the bonding pad part 50. In addition, the protective layer 70 is thinner at a portion that overlaps the bonding pad part 50 than at other portions.

In particular, according to an embodiment, the protective layer 70 is thinner where it overlaps a portion of a short side of the bonding pad part 50, than at other portions. That is, a step difference is formed in the protective layer 70 at the portion that overlaps the short side of the bonding pad part 50.

According to an embodiment, FIGS. 4 and 5 are sectional views that illustrate a state in which an IC chip 80 is mounted on the bonding pad part 50 exposed through the opening 70a of the protective layer 70.

According to an embodiment, bumps 84 and 82 of the IC chip 80 are electrically connected to the input and output pads 54 and 52 of the bonding pad part 50 through conductive balls 92 of an anisotropic conductive film 90.

According to an embodiment, if the anisotropic conductive film 90 is disposed between the bonding pad part 50 and the IC chip 80, and the IC chip 80 is compressed through a process such as thermo-compression, the conductive balls 92 are broken, and therefore, the bumps 84 and 82 may be electrically connected to the input and output pads 54 and 52.

Referring to FIG. 5, according to an embodiment, at least two power lines 60a and 60b that connect the input pads 54 of the bonding pad part 50 and the input pad part 40 are disposed to intersect the short side of the bonding pad part 50, and are supplied with voltages different from each other. In this case, as the protective layer 70 overlaps with the portion of the short side of the bonding pad part 50, the power lines 60a and 60b are disposed at a lower portion of the protective layer 70.

In general, according to an embodiment, the IC chip 80 is fabricated on a wafer through a semiconductor process and then separated from the wafer through a cutting process.

Characters or numbers are marked at an outermost edge of the wafer using a conductive material, such as aluminum (Al), such that the wafer can be distinguished from others. In this case, the conductive material in a marking region can remain on an edge of a short side of the IC chip due to alignment errors in the process of separating the IC chip 80 from the wafer.

Figure 6:
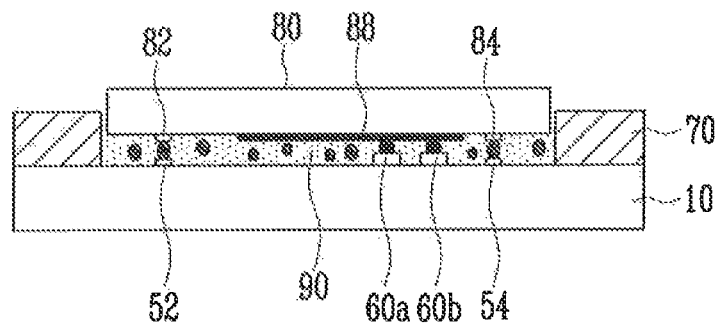
FIG. 6 is a sectional view that illustrates a flat panel display according to an embodiment of the present disclosure.

According to an embodiment, FIG. 6 is a sectional view that illustrates a state in which the IC chip 80 that has conductive material 88 remaining on an edge of the short side thereof is mounted on the bonding pad part 50. If the opening 70a of the protective layer 70 has the same size as the bonding pad part 50, the anisotropic conductive film 90 is interposed between the conductive material 88 and the power lines 60a and 60b. Hence, the conductive material 88 and the power lines 60a and 60b may be short-circuited by the conductive balls 92 as the power lines 60a and 60b are supplied with different voltages, causing a failure.

For example, one of the two power lines 60a and 60b may be a power line supplied with a voltage (e.g., 4.0 V) that detects a failure caused by a crack of the substrate 10 in early stage, and the other may be a power line supplied with a driving voltage (e.g., 6.7 V) that drives the pixel array 13.

However, according to an embodiment of the present disclosure, as the protective layer 70 overlaps a portion of the short side of the bonding pad part 50 as shown in FIG. 5, the power lines 60a and 60b can be disposed at the lower portion of the protective layer 70. Accordingly, a short-circuit between the two power lines 60a and 60b can be prevented in advance even when the conductive material 88 remains on the edge of the short side of the IC chip 80.

Although a structure in which both of the two power lines 60a and 60b are disposed at the lower portion of the protective layer 70 to intersect the short side of the bonding pad part 50 has been described, embodiments are not limited thereto. For example, in another embodiment, one of the power lines 60a or 60b can be disposed at the lower portion of the protective layer 70 to intersect the short side of the bonding pad part 50.

Although a structure in which the two power lines 60a and 60b are disposed on the same plane has been described, embodiments are not limited thereto. For example, in another embodiment, the two power lines 60a and 60b can be disposed in different layers with an insulating layer interposed therebetween.

Although a flat panel display in which the IC chip 80 includes, for example, functions of a data driving circuit, is mounted on the bonding pad part 50 has been described, it will be apparent that other embodiments may include a flat panel display in which an IC chip that includes functions of a scan driving circuit can be mounted on the bonding pad part 50.

Figure 7:
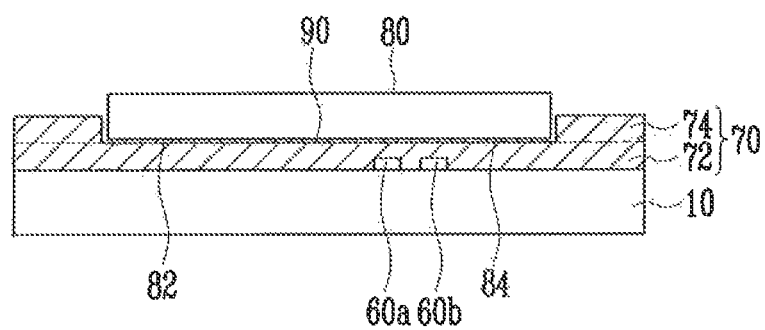
FIG. 7 is a sectional view that illustrates a flat panel display according to another embodiment of the present disclosure.

FIG. 7 is a sectional view that illustrates a flat panel display according to another embodiment of the present disclosure, which illustrates a section taken along line B1-B2 of FIG. 3.

According to an embodiment, a flat panel display of FIG. 7 is similar to a flat panel display of FIG. 5, except for a protective layer 70 formed in a stack structure having a first layer 72 and a second layer 74, where a portion of the first layer 72 overlaps the bonding pad part 50.

According to an embodiment, a plurality of layers made of an organic material, such as an interlayer insulating layer and a pixel defining layer, are included in a device forming layer that includes the pixel array 13. For example, the first layer 72 is formed in a process of forming the interlayer insulating layer, and the second layer 74 is formed in a process of forming the pixel defining layer, so that an embodiment of the present disclosure can be easily implemented without adding a separate photolithography process, etc.

Figure 8:
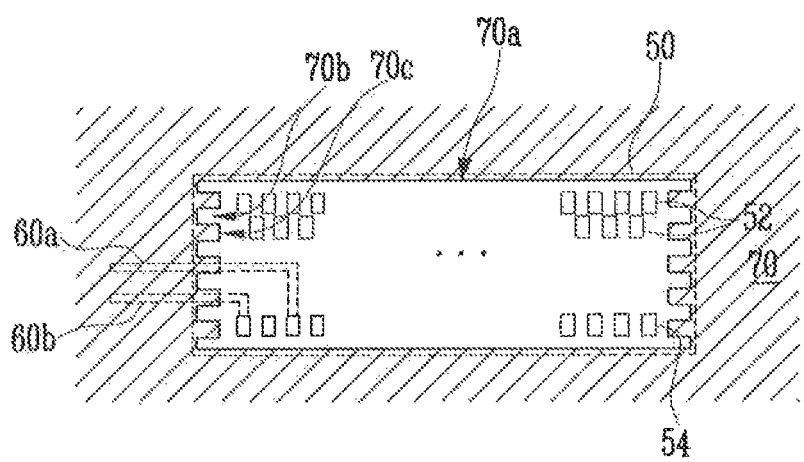
FIG. 8 is a plan view that illustrates a flat panel display according to another embodiment of the present disclosure.

FIG. 8 is a plan view of the protective layer 70 that illustrates a flat panel display according to another embodiment of the present disclosure.

Referring to FIG. 8, according to an embodiment, the protective layer includes at least one concave part 70b and at least one convex part 70c provided at a side portion thereof that overlaps the bonding pad part 50, and at least one power line 60a or 60b is disposed at a lower portion of the protective layer 70 that overlaps the convex part 70c.

According to embodiments, concave part 70b and the convex part 70c can have various shapes, such as a rectangular shape, a spherical shape, or a sawtooth shape.

According to an embodiment, if the protective layer 70 is formed of an organic material, the IC chip 80 does not completely adhere to the bonding pad part 50 due to elastic or restorative forces of the protective layer 70 when the anisotropic conductive film 90 is disposed between the bonding pad part 50 and the IC chip 80. Thus, the IC chip 80 may be compressed through a process such as thermo-compression. Therefore, the contact between the bumps 84 and 82 and the pads 54 and 52 may be poor. In this case, the restorative force is dispersed in a space of the concave part 70b, and hence the IC chip 80 can be easily adhered to the bonding pad part 50. Accordingly, the electrical contact between the bumps 84 and 82 and the pads 54 and 52 is stable when the IC chip 80 is completely adhered to the bonding pad part 50, and a contact failure can be prevented.

According to an embodiment of the present disclosure, when an opening that exposes an input pad part and a bonding pad part therethrough is formed after a protective layer is formed on a substrate of a non-display region, the opening is formed such that the protective layer overlaps a portion of the bonding pad part.

According to an embodiment, conductive lines, such as a power line, that intersect a short side of the bonding pad part are disposed at a lower portion of the protective layer. Hence, when an IC chip is mounted on the bonding pad part, an unwanted electrical short circuit between the IC chip and the bonding pad or the power line can be effectively prevented.

Further, according to another embodiment of the present disclosure, concave and convex parts are formed at a side portion of the protective layer that overlaps a portion of the bonding pad part, so that electrical contact can be made when the IC chip is completely adhered to the bonding pad part.

Exemplary embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A flat panel display comprising:
   a substrate that includes a display region and a non-display region at a periphery of the display region;
   a pixel array disposed on the substrate of the display region, the pixel array displaying an image;
   an input pad part disposed on the substrate of the non-display region;
   a bonding pad part disposed on the substrate of the non-display region, the bonding pad part including a plurality of output pads connected to the pixel array and a plurality of input pads connected to the input pad part; and
   a protective layer disposed on the substrate of the non-display region, the protective layer having an openings formed therein that expose at least portions of the bonding pad part and the input pad part,
   wherein the opening of the protective layer is smaller than the bonding pad part,
   wherein the protective layer is thinner at a portion that overlap the bonding pad part than at portions that do not overlap the bonding pad part.

2. The flat panel display of claim 1, further comprising at least two power lines that connect the input pad part to the input pads of the bonding pad part, the at least two power lines being supplied with voltages different from each other, wherein at least one power line intersects a short side of the bonding pad part.

3. The flat panel display of claim 2, wherein the at least one power line is supplied with one of a voltage that detects a failure caused by a crack of the substrate or a voltage that drives the pixel array.

4. The flat panel display of claim 2, wherein the protective layer overlaps a portion of the short side of the bonding pad part.

5. The flat panel display of claim 4, wherein the protective layer further comprises concave and convex parts at a side portion thereof that overlaps the short side of the bonding pad part,
   wherein the at least one power line is disposed at a lower portion of the protective layer and overlaps the convex part of the protective layer.

6. The flat panel display of claim 2, wherein the at least two power lines are disposed in different layers with an insulating layer interposed therebetween.

7. The flat panel display of claim 1, further comprising an integrated circuit chip mounted on the bonding pad part that is electrically connected to the input pads and the output pads,
   wherein a portion of a short side of the integrated circuit chip overlaps the protective layer.

8. The flat panel display of claim 7, further comprising an anisotropic conductive film that includes a plurality of conductive balls interposed between the bonding pad part and the integrated circuit chip.

9. The flat panel display of claim 1, wherein the protective layer is made of an organic material.

10. The flat panel display of claim 1, wherein the protective layer is formed in a stack structure that includes a first layer and a second layer, and a portion of the first layer overlaps the bonding pad part.

11. A flat panel display comprising:
    a substrate that includes a display region and a non-display region at a periphery of the display region;
    a pixel array disposed on the substrate of the display region, the pixel array displaying an image;
    an input pad part disposed on the substrate of the non-display region;
    a bonding pad part disposed on the substrate of the non-display region, the bonding pad part including a plurality of output pads connected to the pixel array and a plurality of input pads connected to the input pad part; and
    a protective layer disposed on the substrate of the non-display region, the protective layer having an opening formed therein that expose at least portions of the bonding pad part and the input pad part,
    wherein the opening of the protective layer is smaller than the bonding pad part,
    wherein the protective layer overlaps a portion of the short side of the bonding pad part.

12. The flat panel display of claim 11, further comprising at least two power lines that connect the input pad part to the input pads of the bonding pad part, the at least two power lines being supplied with voltages different from each other,
    wherein at least one power line intersects a short side of the bonding pad part.

13. The flat panel display of claim 12, wherein the at least one power line is supplied with one of a voltage that detects a failure caused by a crack of the substrate or a voltage that drives the pixel array.

14. The flat panel display of claim 12, wherein the protective layer is thinner at a portion that overlap the bonding pad part than at portions that do not overlap the bonding pad part.

15. The flat panel display of claim 12, wherein the protective layer further comprises concave and convex parts at a side portion thereof that overlaps the short side of the bonding pad part, wherein the at least one power line is disposed at a lower portion of the protective layer to overlap the convex part of the protective layer.

16. The flat panel display of claim 12, wherein the at least two power lines are disposed in different layers with an insulating layer interposed therebetween.

17. The flat panel display of claim 11, further comprising an integrated circuit chip mounted on the bonding pad part that is electrically connected to the input pads and the output pads, wherein a portion of a short side of the integrated circuit chip overlaps the protective layer.

18. The flat panel display of claim 17, further comprising an anisotropic conductive film that includes a plurality of conductive balls interposed between the bonding pad part and the integrated circuit chip.

19. The flat panel display of claim 11, wherein the protective layer is made of an organic material.

20. The flat panel display of claim 11, wherein the protective layer is formed in a stack structure that includes a first layer and a second layer, and a portion of the first layer overlaps the bonding pad part.

* * * * *